(12) United States Patent
Prest

(10) Patent No.: US 7,743,496 B2
(45) Date of Patent: Jun. 29, 2010

(54) CABLE TERMINATION METHODS

(75) Inventor: Christopher D. Prest, Mountain View, CA (US)

(73) Assignee: Apple Inc., Cupertino, CA (US)

( * ) Notice: Subject to any disclaimer, the term of this patent is extended or adjusted under 35 U.S.C. 154(b) by 221 days.

(21) Appl. No.: 12/004,539

(22) Filed: Dec. 20, 2007

(65) Prior Publication Data

US 2009/0158584 A1 Jun. 25, 2009

(51) Int. Cl.
*H01R 43/00* (2006.01)

(52) U.S. Cl. .............................. 29/857; 29/858; 29/876; 439/606; 439/660

(58) Field of Classification Search .................. 29/857, 29/858, 876; 439/606, 660
See application file for complete search history.

(56) References Cited

U.S. PATENT DOCUMENTS

| | | | | |
|---|---|---|---|---|
| 6,004,160 | A * | 12/1999 | Korsunsky et al. | 439/660 |
| 6,402,552 | B1 * | 6/2002 | Wagner | 439/606 |
| 6,916,198 | B2 * | 7/2005 | Wu et al. | 439/497 |
| 7,320,616 | B1 * | 1/2008 | Legrady et al. | 439/404 |
| 2006/0141828 | A1 * | 6/2006 | Dean et al. | 439/98 |

* cited by examiner

*Primary Examiner*—C. J Arbes
(74) *Attorney, Agent, or Firm*—Ropes & Gray LLP; Robert R. Jackson

(57) ABSTRACT

A termination for a multi-conductor cable is made by providing a metal structure that includes a plurality of parallel but spaced apart fingers that are joined together by a connecting member adjacent at least one end of each finger. Each of the conductors in the cable is connected to a respective one of the fingers at a location that is spaced from the connecting member. The cable and the fingers are then over-molded with an insulating material where the conductors are connected to the fingers. This over-molding leaves a portion of the length of each finger exposed. The connecting member is then severed and removed.

11 Claims, 4 Drawing Sheets

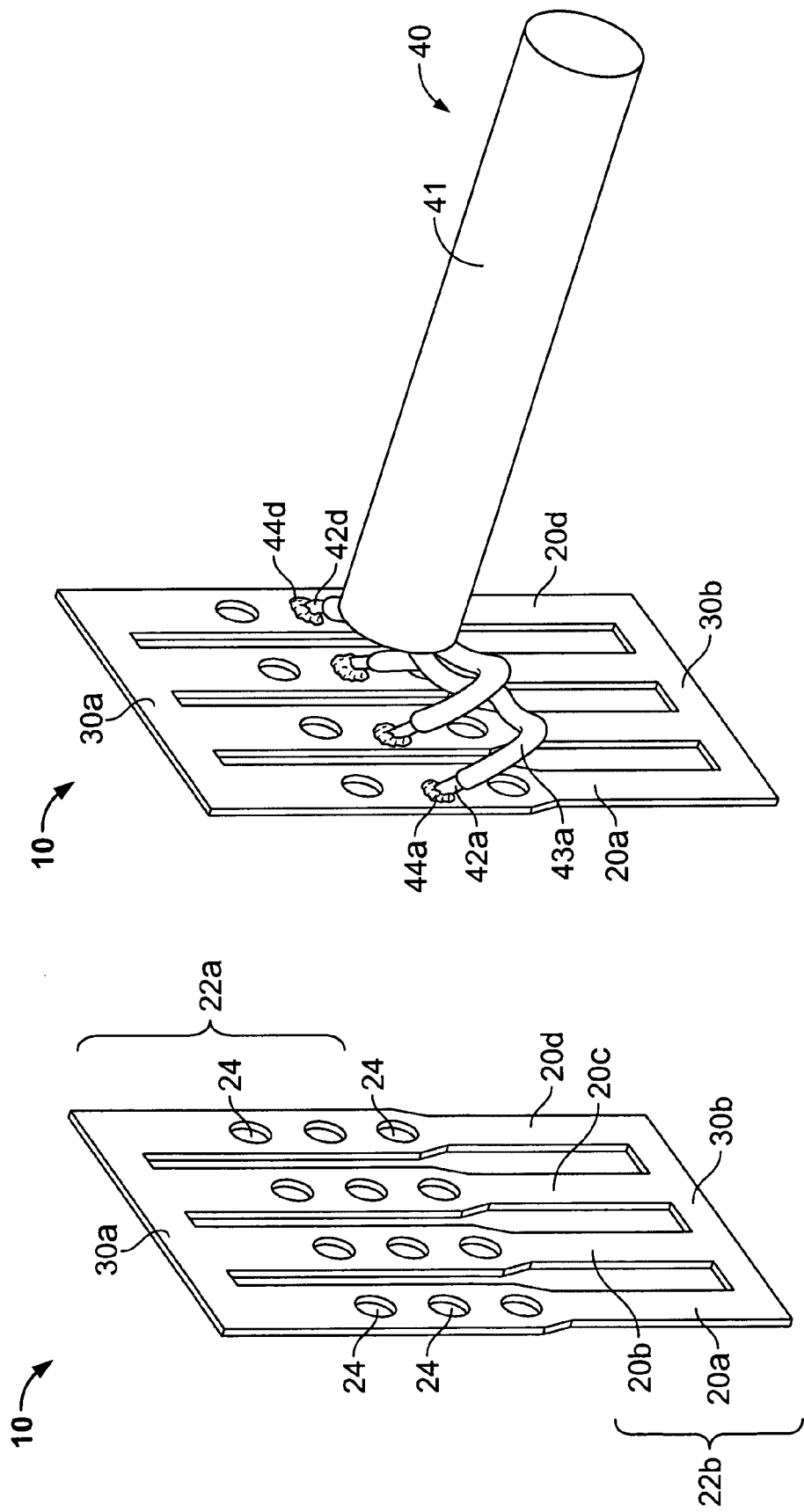

CABLE TERMINATION METHODS

BACKGROUND OF THE INVENTION

This invention relates to electrical connectors for use in electronic circuitry for making electrical and mechanical connections of multi-conductor cables to other circuit structures and components.

Connecting the wires of a multi-conductor cable to another electronic circuit component such as a printed circuit board ("PCB") should be done in a way that is rapid and efficient and produces strong and reliable electrical and mechanical connection of the cable and its conductors to the other component. Especially for products where the cable may be subject to on-going stress during use of the finished product, it is desirable for the connection of the cable to the other component to be able to resist such stress and not fail to maintain secure and reliable connection of the cable. Improvements to cable termination technology are therefore always being sought.

SUMMARY OF THE INVENTION

In accordance with certain aspects of the present invention, a termination or connector for a multi-conductor cable is made using a substantially flat piece of metal that has a plurality of substantially parallel, laterally-spaced-apart fingers that are initially connected together by at least one transverse member joining at least one end of the fingers. Each of the conductors (wires) of the multi-conductor cable is electrically and mechanically connected to a respective one of the fingers. The end of the cable adjacent the metal component and at least the portion of the fingers to which the wires have been attached are then enclosed in an insulating material (e.g., by molding the insulating material around the structure to be enclosed). Another portion of each finger is not so enclosed, and the transverse member is preferably also not so enclosed. The transverse member is then removed from the fingers, which leaves the fingers electrically isolated from one another, but still mechanically stable relative to one another by being partly embedded in the insulating material. The portion of the fingers that are not embedded in the insulating material project from the insulating material and can be used as exposed electrical contacts for electrically and mechanically connecting the structure described above to other circuitry requiring connection to the cable.

Further features of the invention, its nature and various advantages, will be more apparent from the accompanying drawings and the following detailed description.

BRIEF DESCRIPTION OF THE DRAWINGS

FIG. 1 is a simplified perspective or isometric view of an illustrative embodiment of a component that can be provided and used in accordance with the invention.

FIG. 2 is a simplified perspective or isometric view of an illustrative embodiment of use of the FIG. 1 component in accordance with the invention.

DETAILED DESCRIPTION

Figure 3:
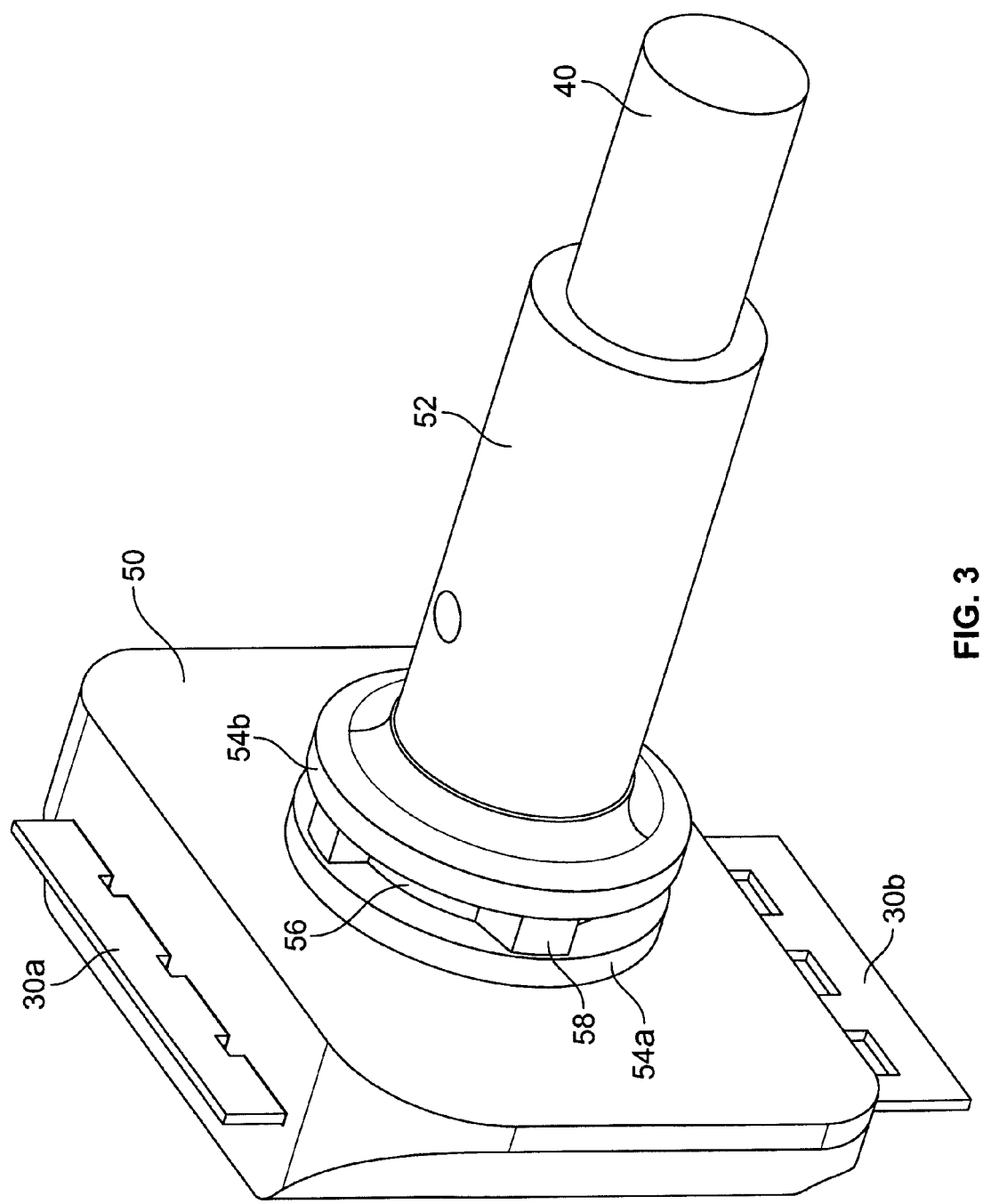
FIG. 3 is a simplified perspective or isometric view of an illustrative embodiment of further use of what is shown in FIG. 2 in accordance with the invention.

An illustrative embodiment of a component 10 that can be used in accordance with the invention is shown in FIG. 1. In this embodiment, component 10 is a substantially flat piece of metal that includes four, substantially parallel, but laterally spaced-apart parts that may be referred to as tines or fingers 20a-d. The use of four such fingers 20 is only illustrative, and it will be understood that smaller or larger numbers of fingers 20 can be used (as long as there is a plurality of such fingers). At their upper ends (as viewed in FIG. 1), fingers 20 are all connected together by a transverse part 30a of component 10. Similarly, at their lower ends, fingers 20 are again all connected together by another transverse part 30b of component 10.

Each of fingers 20 is axially divided into two different regions: an upper region 22a and a lower regions 22b (as viewed in FIG. 1). The upper region 22a of each finger 20 is preferably somewhat wider than the lower region 22b. In addition, the upper region 22a of each finger 20 preferably includes one or more apertures 24 through that finger (from one of the major planar surfaces of component 10 to the other of the major planar surfaces of that component). Although three holes 24 are shown through the region 22a of each finger 20 in the illustrative embodiment shown in FIG. 1, it will be understood that any number of such holes (or alternatively no holes) can be provided in each finger 20.

FIG. 2 shows an illustrative embodiment of a next step in the formation of a connector in accordance with this invention. As shown in FIG. 2, the end of each of four wires 42a-d in four-conductor cable 40 is exposed from overall cable jacket or insulation 41 and from that conductor's individual conductor insulation 43a-d, and that wire is soldered to a respective one of fingers 20a-d as shown at 44a-d. This soldering is preferably done to the region 22a of each finger 20, and still more preferably at an aperture 24 through each finger. For example, the exposed end of a wire 42 may be passed through an aperture 24, and then the aperture may be filled in around the wire with solder 44 to make a secure mechanical and electrical connection between the wire and the now-connected finger 20.

An illustrative embodiment of a next step in the formation of a connector in accordance with the invention is shown in FIG. 3. In this step an insulating material 50 is formed around the end portion of cable 40, the wires 42 that were exposed from the wire and cable insulation and soldered to metal component 10, and a substantial part of the length of fingers 20a-d. In particular, the portions of the lengths of fingers 20 that are covered by insulating material 50 preferably include all of the length of upper regions 22a (with the exception of a small amount immediately adjacent to upper transverse member 30a), and a small amount of lower regions 22b immediately adjacent to upper regions 22a. A substantial lower portion of regions 22b is not covered by material 50. Transverse members 30a and 30b are also not covered by insulating material 50. A preferred technique for forming material 50 as shown in FIG. 3 and described above is insert molding (the "insert" in the mold being everything shown in FIG. 2 that is described above as becoming covered by material 50). This step may also be referred to as over-molding.

Note that several features of metal component 10 help to ensure that, after material 50 has been molded around it as described above and that material has cured (hardened to what is effectively a solid), fingers 20 maintain their relative positions in material 50. Some of these features are extra apertures 24, through which material 50 passes to help anchor fingers 20 in material 50. Material 50 also passes through the spaces between laterally adjacent fingers 20. This also helps to keep fingers 20 in place, aligned with one another, and spaced apart from one another in material 50. The fact that the finger-width transitions (from regions 22a to regions 22b) are embedded in material 50 also helps to resist any tendency of fingers 20 to pull out of material 50 in the downward direction. Molding of material 50 around individual wires 42/43, solder regions 44, and cable insulation 41 (to which material 50 preferably forms a mechanical bond) also helps to stabilize metal component 10 in material 50, and to enable material 50 to greatly increase the strength of the mechanical connection between cable 40 and its individual wires 42, on the one hand, and metal component 10, on the other hand. The portion 52 of material 50 that extends upstream along cable 40 may also help to distribute the effects of lateral flexure of the cable along some length of the cable, thereby helping to reduce the risk of cable breakage due to sharp or concentrated lateral flexure of the cable at one location. For this purpose, portion 52 of material 50, which extends annularly around cable 40, may be relatively thin to give portion 52 some lateral flexibility.

If desired, material 50 may be formed with additional external features that can help anchor the connector to a housing of electronic circuitry with which the connector will be used. In the illustrative embodiment shown in FIG. 3 these external features include two flanges 54a and 54b that extend annularly around the longitudinal axis of cable 40 at respective different locations along that axis. The wall of the above-mentioned circuitry housing can fit into the channel 56 between the two flanges to help prevent cable 40 and its connector from being pulled away from the housing or being forced farther into the housing. Channel 56 can also be non-circular (e.g., as a result of the provision of a key 58 extending into the channel at one or more locations around the channel) to additionally prevent rotation of cable 40 and its connector about the longitudinal axis of the cable relative to the above-mentioned circuitry housing.

Figure 4:
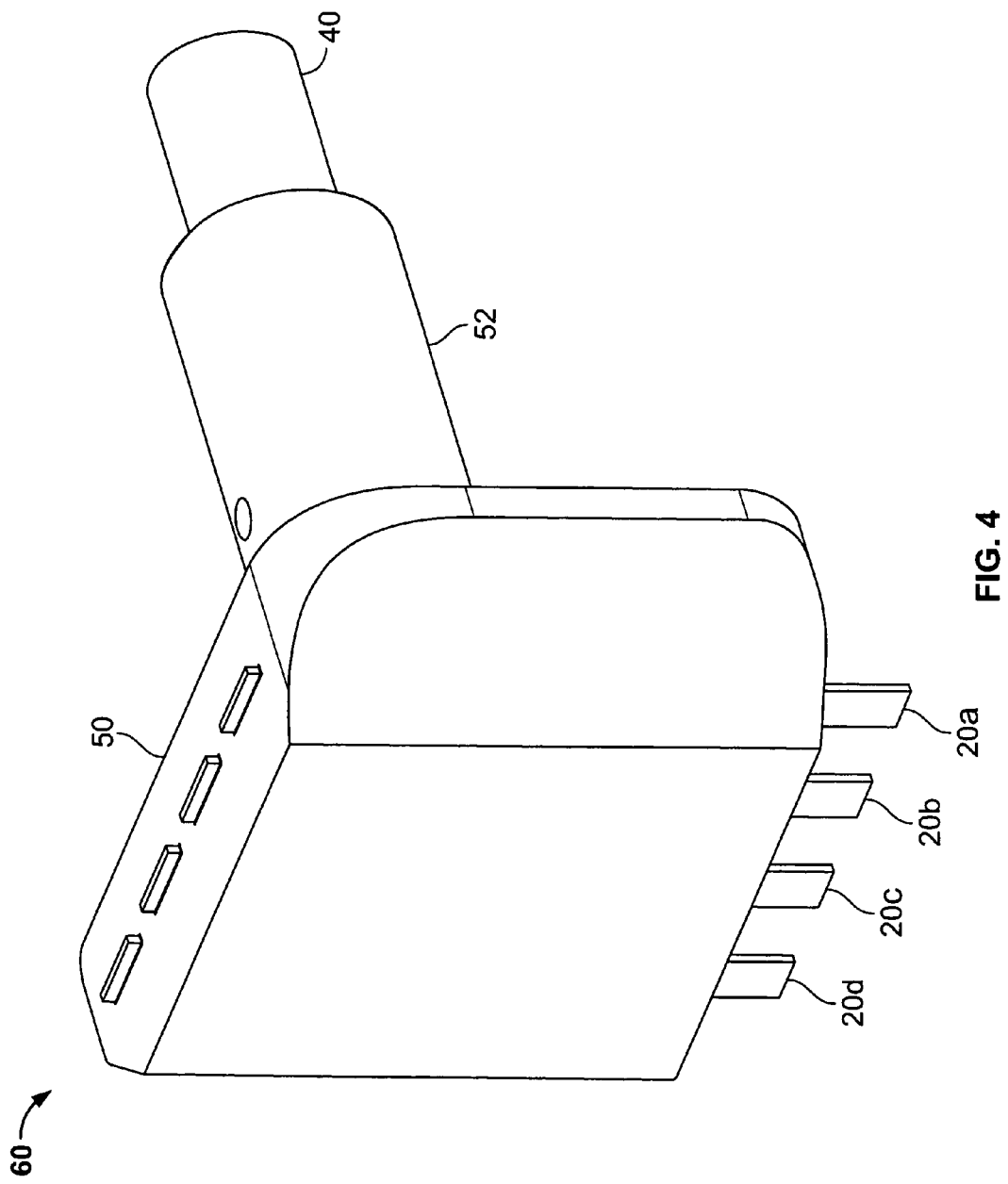
FIG. 4 is a simplified perspective or isometric view of an illustrative embodiment of still further use of what is shown in FIG. 3 in accordance with the invention.

An illustrative embodiment of a next step in forming a connector 60 in accordance with the invention is shown illustratively in FIG. 4. This step involves trimming off and removing the transverse members 30a and 30b of metal component 10. This leaves fingers 20 electrically isolated (insulated) from one another. A portion of the region 22b of each finger 20 projects from the lower portion of material 50 as is clearly visible in FIG. 4. The thus-projecting portions of fingers 20 constitute the exposed metal contacts of connector 60. These exposed metal contacts can be used for electrically (and mechanically) connecting connector 60 to other circuitry with which the connector will be used.

Figure 5:
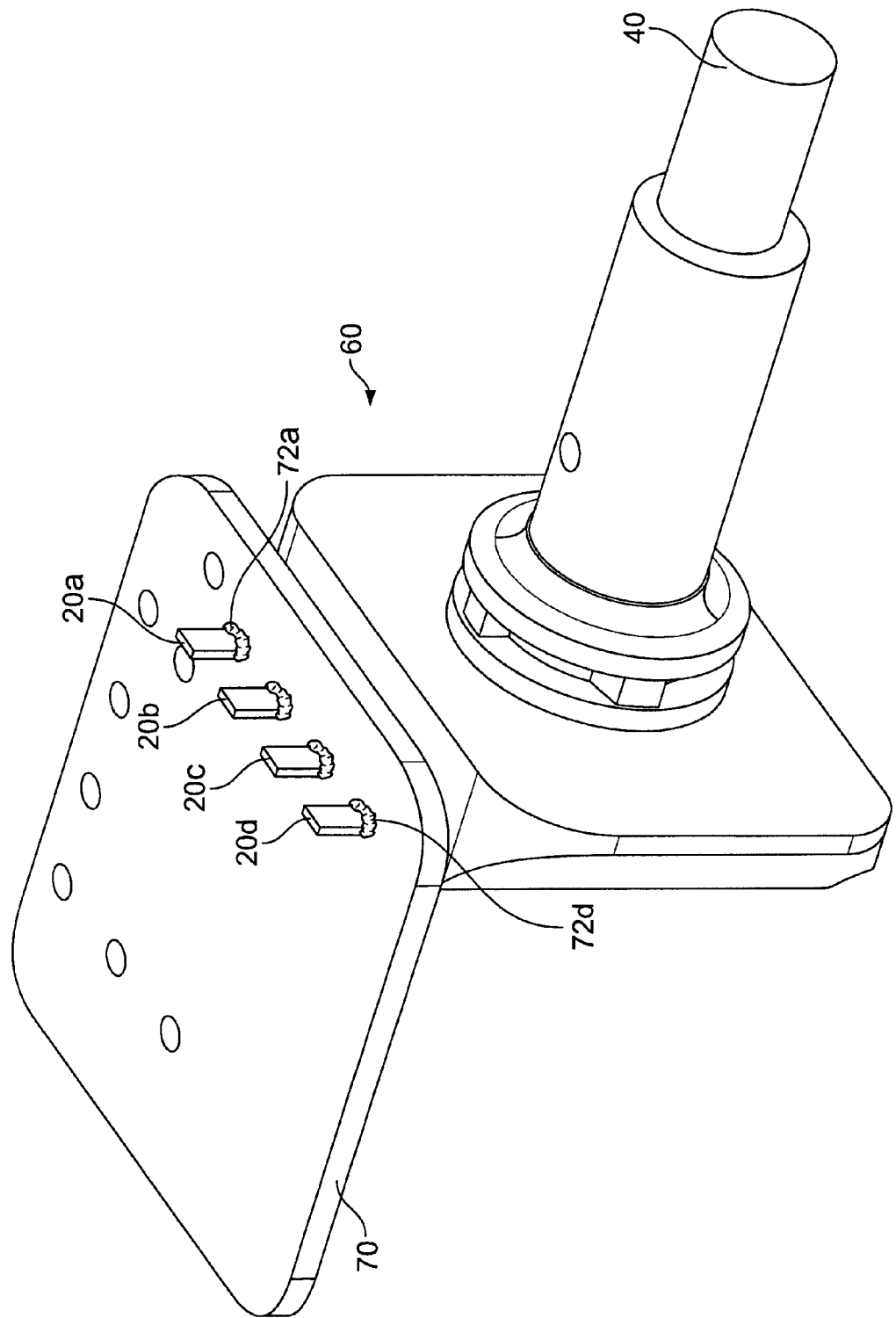
FIG. 5 is a simplified perspective or isometric view of an illustrative embodiment of yet further use of what is shown in FIG. 4 in accordance with the invention.

FIG. 5 shows an illustrative embodiment of use of connector 60 from FIG. 4 in accordance with possible further aspects of the invention. As shown in FIG. 5, exposed metal contacts 20a-d of connector 60 are pushed through respective apertures in printed circuit board ("PCB") 70. Each of contacts 20a-d is then soldered at 72a-d to electrically connect that contact to a respect circuit trace on PCB 70. Note that solder 72 also helps to permanently mechanically secure connector 60 to PCB 70.

Although the following geometric considerations are not necessarily present in all embodiments of the invention, they can constitute preferred features. It will be noted that in the embodiments that have been shown and described, the principal plane of metal component 10 is substantially perpendicular to the longitudinal axis of cable 40. This results in contacts 20a-d in finished connector 60 being transverse to (not parallel to or aligned with) the longitudinal axis of cable 40. Contacts 20a-d are therefore pushed into the apertures in PCB 70 along an axis that is substantially perpendicular to the longitudinal axis of cable 40. This means that any subsequent axial pulling (or pushing) on cable 40 is not aligned with the axis along which connector 60 goes into apertures in PCB 70, and so such pulling or pushing on cable 40 does not work (at least not directly) to pull contacts 20 out of the PCB apertures. This can be desirable to provide more secure attachment of cable 40 to PCB 70.

It will be understood that the foregoing is only illustrative of the principles of the invention, and that various modifications can be made by those skilled in the art without departing from the scope and spirit of the invention. For example, although connectors with four contacts 20a-d are shown and described for the most part herein, it will be understood that the invention can be used to make connectors having any plural number of contacts. As another example of modifications within the scope of the invention, it may be possible in some embodiments to eliminate one of the two transverse members 30 that are generally shown and described elsewhere in this specification. Metal component 10 would then be more like a fork, and it would only be necessary to cut off the one transverse member 30a or 30b to produce a result like that shown in FIG. 4.

The invention claimed is:

1. A method of terminating a multi-conductor cable comprising:
   providing a metal structure that includes a plurality of substantially parallel, spaced apart, metal fingers that are joined together adjacent at least one end of each finger by a metal connecting member that is part of the metal structure, the metal structure by itself maintaining the fingers in parallel, spaced apart relationship to one another;
   mechanically and electrically connecting each one of the conductors to a respective one of the fingers at a location along the finger that is spaced from the connecting member, said connecting being performed prior to over-molding any insulating material onto the metal structure;
   over-molding with an insulating material the cable and the fingers where the conductors have been connected to the fingers, said over-molding leaving a portion of the length of each finger exposed; and
   severing the connecting member from the fingers.

2. The method defined in claim 1 wherein after the severing, a portion of the length of each finger is still exposed.

3. The method defined in claim 2 further comprising:
   inserting the portion of the length of each finger that is still exposed into an aperture in an electrical circuit.

4. The method defined in claim 3 further comprising:
   connecting the portion of each finger that has been inserted into the electrical circuit to electrical circuitry of the electrical circuit.

5. The method defined in claim 4 wherein the connecting the portion of each finger to electrical circuitry comprises:
   soldering the portion of each finger to the electrical circuitry.

6. The method defined in claim 1 wherein the connecting comprises:
   soldering each of the conductors to a respective one of the fingers.

7. The method defined in claim 1 further comprising:
   providing each of the fingers with a through aperture at the location where the connecting will be performed.

8. The method defined in claim 1 further comprising:
providing each of the fingers with a through aperture where the over-moldering will cover the finger and will therefore enter the aperture.

9. The method defined in claim 1 wherein the cable includes an outer cover around the conductors adjacent to, but spaced from, where the connecting is performed, and wherein the over-molding covers and bonds with the outer cover adjacent to where the connecting is performed.

10. The method defined in claim 9 wherein the over-molding also forms a shape separate from the fingers that can be used to provide a mechanical connection to other structure that the cable is to be connected to.

11. The method defined in claim 1 wherein the over-molding also leaves the connecting member exposed.

* * * * *